United States Patent
Wu et al.

(10) Patent No.: US 7,835,890 B2
(45) Date of Patent: Nov. 16, 2010

(54) HOT CARRIER CIRCUIT RELIABILITY SIMULATION

(75) Inventors: Lifeng Wu, Fremont, CA (US); Zhihong Liu, Cupertino, CA (US); Alvin I. Chen, San Jose, CA (US); Jeong Y. Choi, Portland, OR (US); Bruce W. McGaughy, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 479 days.

(21) Appl. No.: 11/867,554

(22) Filed: Oct. 4, 2007

(65) Prior Publication Data

US 2008/0027699 A1    Jan. 31, 2008

Related U.S. Application Data

(62) Division of application No. 09/832,933, filed on Apr. 11, 2001, now Pat. No. 7,292,968.

(60) Provisional application No. 60/236,865, filed on Sep. 29, 2000, provisional application No. 60/236,587, filed on Sep. 29, 2000, provisional application No. 60/236,586, filed on Sep. 29, 2000.

(51) Int. Cl.
*G06F 17/50* (2006.01)
*G06F 9/44* (2006.01)

(52) U.S. Cl. .................. 703/2; 703/14; 703/17; 717/124; 324/719

(58) Field of Classification Search ............ 703/13, 703/14, 2, 17; 716/4, 5; 717/124; 324/719
See application file for complete search history.

(56) References Cited

U.S. PATENT DOCUMENTS 5,533,197 A    7/1996    Moran et al.

(Continued)

OTHER PUBLICATIONS

Karam, Medhat, et al., "Implmentation of Hot-Carrier Reliability Simulation in Eldo" and related Internet material, Deep Submicron Technical Publication, dated Sep. 2000.

(Continued)

*Primary Examiner*—Thai Phan
(74) *Attorney, Agent, or Firm*—Wheelock Chan LLP; Thomas Chan

(57) ABSTRACT

The present invention is directed to a number of improvements in methods for reliability simulations in aged circuits whose operation has been degraded through hot-carrier or other effects. A plurality of different circuit stress times can be simulated within a single run. Different aging criteria may be used for different circuit blocks, circuit block types, devices, device models and device types. The user may specify the degradation of selected circuit blocks, circuit block types, devices, device models and device types independently of the simulation. Device degradation can be characterized in tables. Continuous degradation levels can be quantized. Techniques are also described for representing the aged device in the netlist as the fresh device augmented with a plurality of independent current sources connected between its terminals to mimic the effects of aging in the device. The use of device model cards with age parameters is also described. To further improve the circuit reliability simulation, a gradual or multi-step aging is used instead of the standard one step aging process. Many of these features can be embedded within the circuit simulator. A user data interface is also presented to implement these techniques and further allow users to enter their device models not presented in the simulator. For example, a proprietary model of, say, the substrate current in an NMOS could used be with a SPICE simulator employing a different model to simulate the aging of the circuit.

9 Claims, 4 Drawing Sheets

U.S. PATENT DOCUMENTS

| | | | |
|---|---|---|---|
| 5,600,578 A * | 2/1997 | Fang et al. | 703/14 |
| 5,600,844 A | 2/1997 | Shaw et al. | |
| 5,606,518 A | 2/1997 | Fang et al. | |
| 5,615,377 A | 3/1997 | Shimizu et al. | |
| 5,634,001 A | 5/1997 | Mittl et al. | |
| 5,761,481 A | 6/1998 | Kadoch et al. | |
| 5,974,247 A | 10/1999 | Yonezawa | |
| 6,024,478 A | 2/2000 | Yamamoto | |
| 6,047,247 A | 4/2000 | Iwanishi et al. | |
| 6,058,496 A | 5/2000 | Gillis et al. | |
| 6,209,122 B1 | 3/2001 | Jyu et al. | |
| 6,216,099 B1 | 4/2001 | Fang et al. | |
| 6,278,964 B1 | 8/2001 | Fang et al. | |
| 6,363,515 B1 | 3/2002 | Rajgopal et al. | |
| 6,414,498 B2 | 7/2002 | Chen | |
| 6,498,515 B2 | 12/2002 | Kawakami et al. | |
| 6,524,872 B1 | 2/2003 | Cheung | |
| 6,530,064 B1 | 3/2003 | Vasanth et al. | |
| 6,795,802 B2 | 9/2004 | Yonezawa et al. | |
| 7,003,755 B2 | 2/2006 | Pang et al. | |
| 7,292,968 B2 * | 11/2007 | Wu et al. | 703/13 |
| 7,567,891 B1 * | 7/2009 | Liu et al. | 703/13 |
| 2003/0055621 A1 * | 3/2003 | Wu et al. | 703/14 |
| 2003/0158713 A1 | 8/2003 | Akimoto et al. | |

OTHER PUBLICATIONS

Lou, Choon-Leong, et al., "A Novel Single-Device DC Method for Extraction of the Effective Mobility and Source-Drain Resistances of Fresh and Hot-Carrier Degraded Drain-Engineered MOSFET's", IEEE Transactions on Electron Devices, vol. 45. No. 6, Jun. 1998, pp. 1317-1323.

Wong, H., et al., "Simulation of Hot-Carrier Reliability in MOS Integrated Circuits", PROC. 21$^{st}$ International Conference on Microelectronics, vol. 2, NIS, Yugoslavia, Sep. 14-17, 1997, pp. 625-628.

Hwang, Nam, et al., "Hot-Carrier Induced Series Resistance Enhancement Model (HISREM) of nMOSFET'S for Circuit Simulations and Reliability Projections", Microelectronics and Reliability, vol. 35, No. 2, pp. 225-239, Feb. 1995, pp. 225-239.

Aur, S., et al., "Modeling of Hot Carrier Effects for LDD Mosfets", 1985 Symposium of VLSI Technology, pp. 112-113.

Jiang, Wenjie, et al., "Key Hot-Carrier Degradation Model Calibration and Verification Issues for Accurate AC Circuit-Level Reliability Simulation", IEEE, 1997, pp. 300-306.

Li et al., "A Probabilistic Timing Approach to Hot-Carrier Effect Estimation," *IEEE Transactions on Computer-Aided Design of Integrated Circuits and Systems*, vol. 13, No. 10, Oct. 1994, pp. 1223-1234.

IsSpice4 User's Guide, *Intusoft*, 1988-1996, pp. 196-216.

Kawakami et al., "Gate-Level Aged Timing Simulation Methodology for Hot-Carrier Reliability Assurance," Proceedings of the ASP-DAC 2000, Asia and South Pacific, Jan. 25-28, 2000, pp. 289-294.

Ye et al., "Developing Aged SPICE Model for Hot Carrier Reliability Simulation," Integrated Reliability Workshop Final Report, 2000, IEEE International, Oct. 23-26, 2000, pp. 153-154.

Hu, "Simulating Hot-Carrier Effects on Circuit Performance," *Semicond. Sci. Technol.* 7 (1992) B555-B558.

Wu et al., "Full-Chip Reliability Simulation for VDSM Integrated Circuits," *Microelectronics Reliability* 41 (2001) pp. 1273-1278.

Seo et al., "The Hot Carrier Degradation and Device Characteristics with Variation of Pre-Metal Dielectric Materials," *Mat. Res. Soc. Symp. Proc.*, vol. 544, 1999, pp. 179-184.

Kim et al., "Oxide Field Dependence of the NMOS Hot-Carrier Degradation Rate and Its Impact an AC-Lifetime Prediction," IEEE, 1995, pp. 37-40.

Chen et al., "Statistical Variation of NMOSFET Hot Carrier Lifetime and Its Impact on Digital Circuit Reliability," *IEEE*, pp. 29-32, 1995.

Chen et al., "A Unified Compact Scalable Model for Hot Carrier Reliability Simulation," *IEEE*, 1999, pp. 243-248.

Kuo, et al., "Simulation of MOSFET Lifetime under AC Hot-Electron Stress," *IEEE Transactions on Electron Devices*, vol. 35, No. 7, Jul. 1988, pp. 1004-1011.

Leblebici et al., "An Integrated Hot-Carrier Degradation Simulator for VLSI Reliability Analysis," *Proceeding ICCAD, IEEE*, 1990, pp. 400-403.

Quader et al., "Hot-Carrier-Reliability Design Rules for Translating Device Degradation to CMOS Digital Circuit Degradation," *IEEE Transactions on Electron Devices*, vol. 41, No. 4, May 1994, pp. 681-691.

Hu, C., "Invited Paper Gate Oxide Scaling Limits and Projection," IEEE, 1996, pp. 13.1.1-13.1.4.

Hu, Chenming, "IC Reliability Simulation", IEEE Journal of Solid-State Circuits, vol. 27, No. 3, Mar. 1992, pp. 241-246.

Ling, C.H., et al., "Simulation of Logarithmic Time Dependence of Hot Carrier Degradation in PMOSFETs", Semicond. Sci. Technol. 10, 1995, pp. 1659-1666.

Jiang, Wenjie, et al., "Assessing Circuit-Level Hot-Carrier Reliability", IEEE, 1998, pp. 173-179.

Li, Chester C., et al., "A New Bi-directional PMOSFET Hot-Carrier Degradation Model for Circuit Reliability Simulation", IEEE, 1992, pp. 20.7.1-20.7.4.

Quader, Khandker N., et al., "A Bidirectional NMOSFET Current Reduction Model for Simulation of Hot-Carrier-Induced Circuit Degradation", IEEE Transactions on Electron Devices, vol. 40, No. 12, Dec. 1993, pp. 2245-2254.

Hsu, Wen-Jay, et al., Advanced Integrated-Circuit Reliability Simulation Including Dynamic Stress Effects, IEEE Journal of Solid-State Circuits, vol. 27, No. 3, Mar. 1992, pp. 247-257.

Chang, Steve S., et al., "A New MOSFET Hot Carrier Model in SPICE Feasible for VLSI Reliability Anaylsis", International Symposium on VLSI Technology, Systems, and Applications, Taipei, Taiwan, R.O.C., May 22-24, 1991, pp. 283-287.

\* cited by examiner

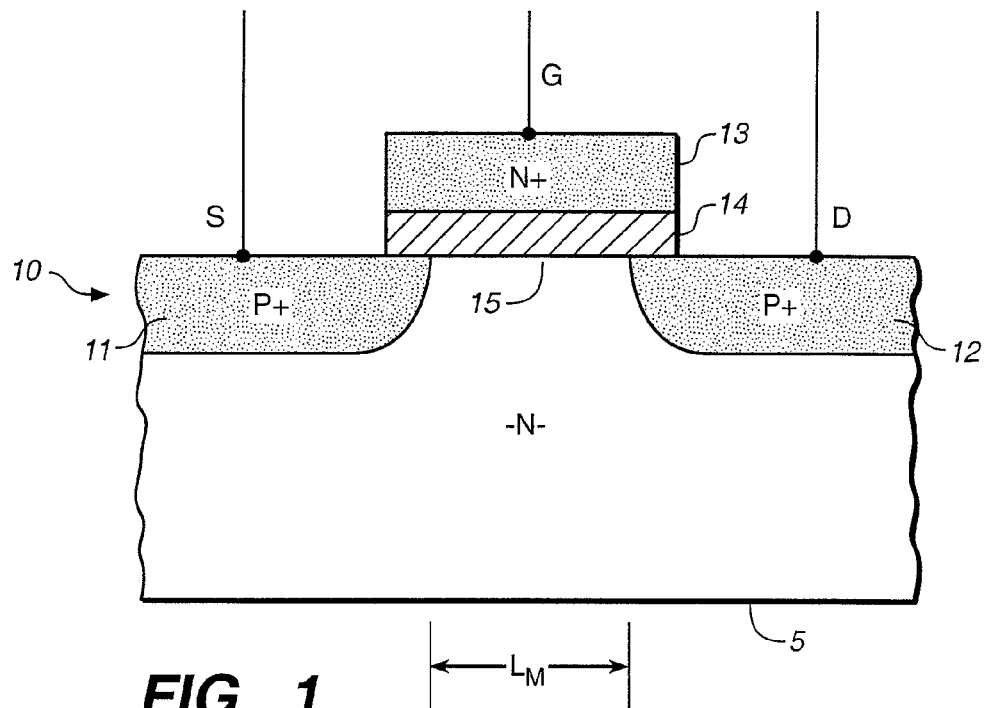
FIG._1
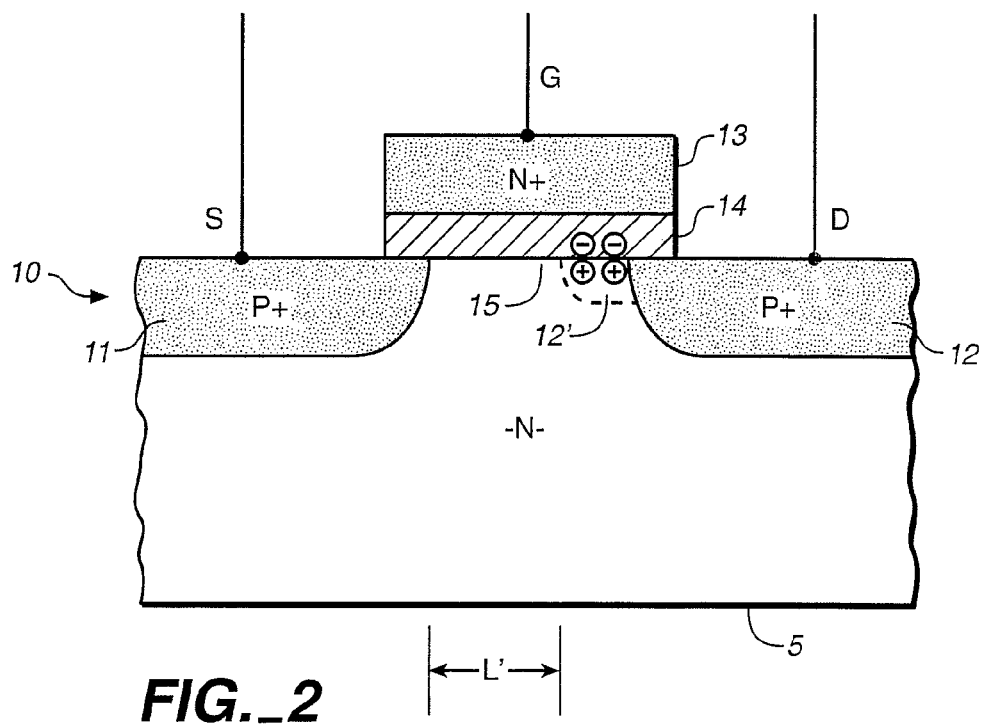
FIG._2

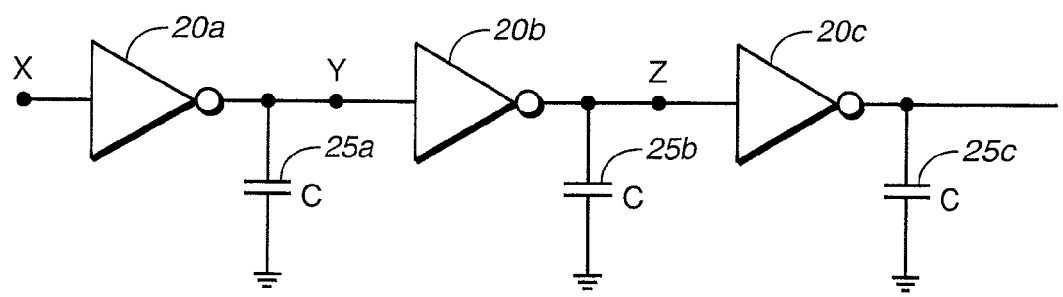
FIG._3
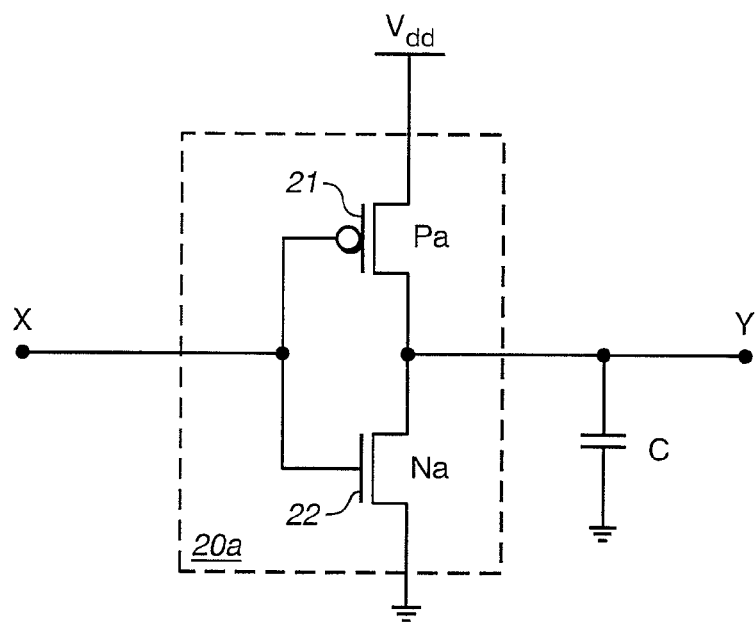
FIG._4

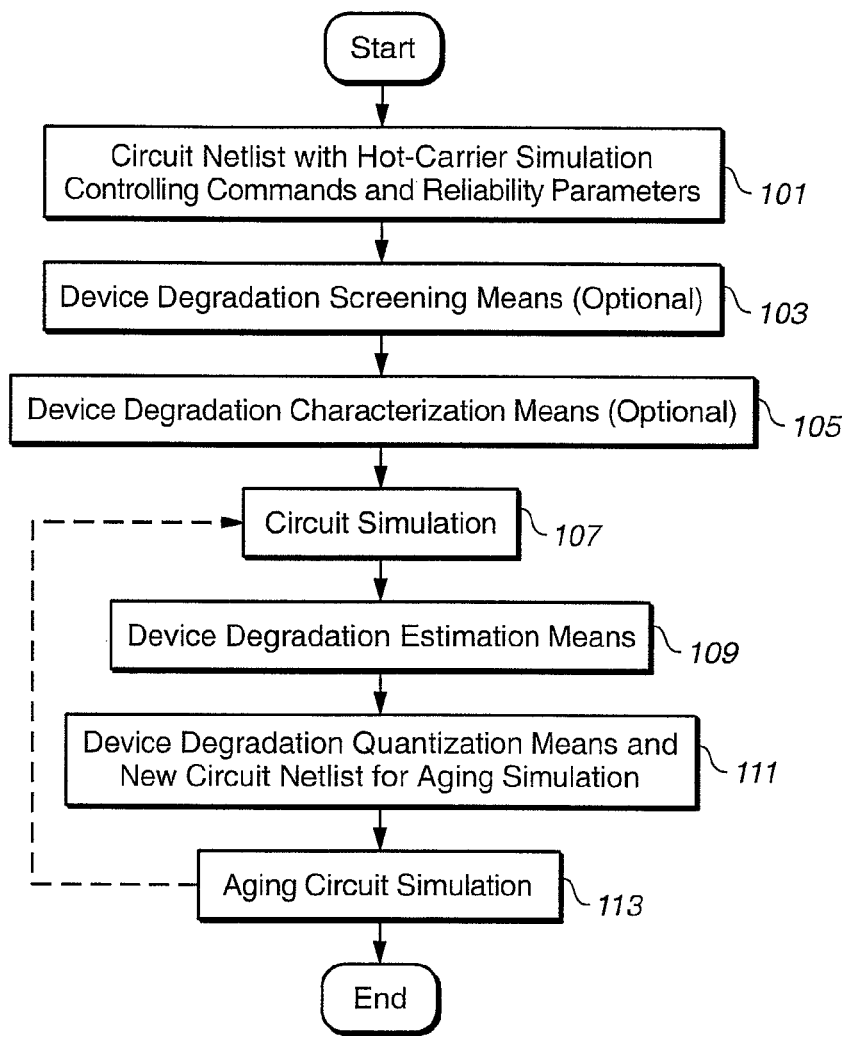
FIG._5
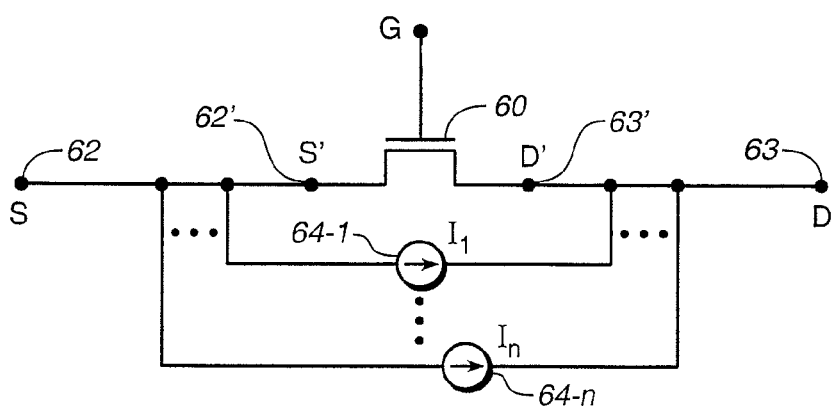
FIG._6

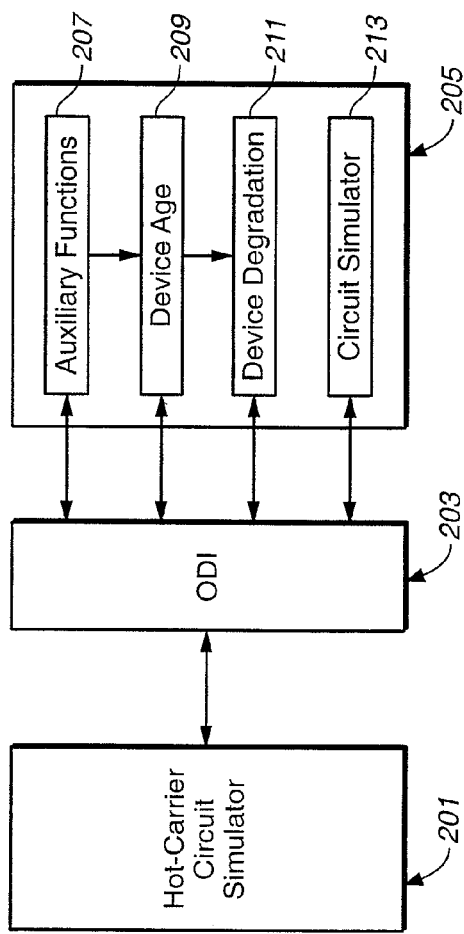
FIG._7
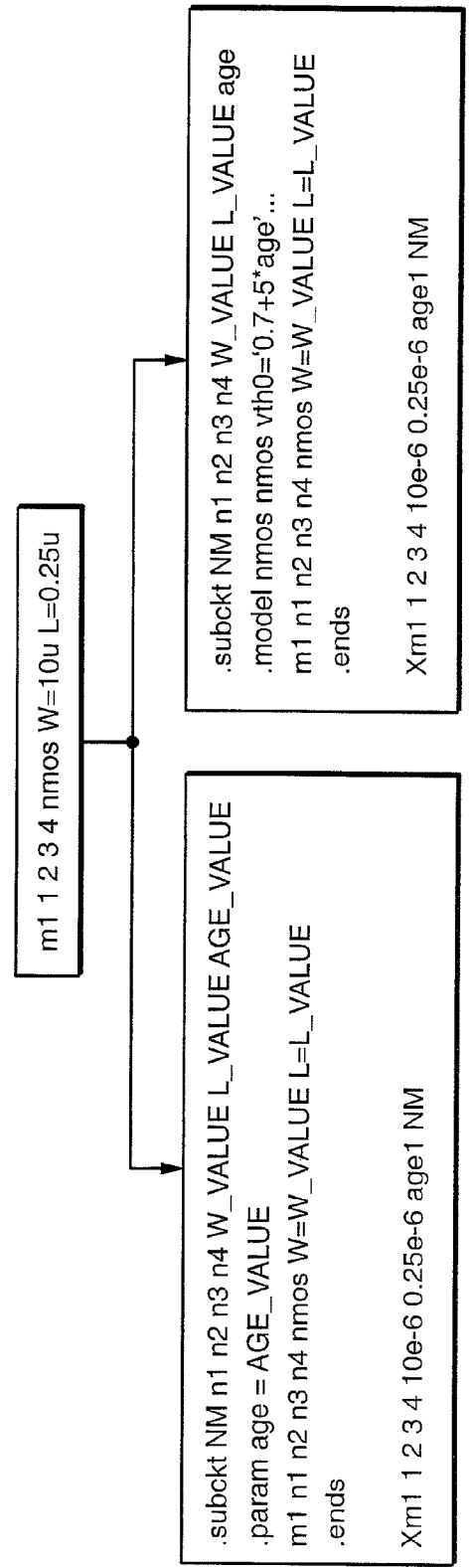
FIG._8

HOT CARRIER CIRCUIT RELIABILITY SIMULATION

CROSS REFERENCE TO RELATED APPLICATIONS

This application is a divisional of U.S. patent application Ser. No. 09/832,933, filed on 11 Apr. 2001, now U.S. Pat. No. 7,292,968, which claims priority from Provisional U.S. patent applications: Ser. No. 60/236,865, entitled "Hot-Carrier Circuit Reliability Simulation", Tiled 29 Sep. 2000; 60/236,587, entitled "Hot-Carrier Device Degradation Modeling and Extraction Methodologies", filed 29 Sep. 2000; and 60/236,586, entitled "Hot-Carrier Reliability Design Rule Checker", filed 29 Sep. 2000.

The above referenced applications are incorporated herein by reference for all purposes. The prior applications, in some parts, may indicate earlier efforts at describing the invention or describing specific embodiments and examples. The present invention is, therefore, best understood as described herein.

FIELD OF THE INVENTION

This invention relates generally to a design aiding apparatus and methods for the design of integrated circuits, and, more specifically, to methods for simulating the time degradation of a circuit due to the hot carrier effect.

COPYRIGHT NOTICE

A portion of the disclosure of this patent document may contain materials that are subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

Complementary metal oxide semiconductor (CMOS) circuits may contain thousands or millions of transistors and other circuit elements. The design of such circuits is extremely complicated and usually employs simulators, such as SPICE, to predict circuit operation. In addition to predicting the operation of the circuit when it is new, it is frequently important to simulate the operation of the circuit as it ages from processes such as hot carrier effects.

FIG. 1 is a schematic of a field effect transistor, the example here being a P-channel MOSFET formed on a silicon substrate, although much of the following discussion applies NMOS transistors and other insulated gate devices. This device may also have a lightly doped drain (LDD) region that is not shown in FIG. 1. Some of the particulars for the NMOS case will be discussed later. The transistor 10 has a bulk N-type region 5, source region 11 and drain region 12 defined at and below the substrate surface, and a lightly doped N-type channel region 15 having a manufactured length $L_M$ in the region between the source 11 and the drain 12. Over the channel region is an oxide or other insulating layer 14 that supports the gate 13. (Here the gate is shown doped as N+, although in a PMOS this may alternately be P+.) When the transistor is turned on, current flows through the channel region below the oxide/silicon interface.

With operation over time, the PMOS transistor 10 will suffer degradation due to device aging. An important mechanism in the aging of insulated gate devices is the "hot carrier" effect. When the transistor is turned on, a current $I_{ds}$ of energized charge carriers flows through the channel 15 from the source 11 to the drain 12. Impact of these charge carriers with silicon atoms near the channel/drain juncture generates electron-hole pairs. Some of the resultant electrons have sufficient energy to pass through the insulating layer 14 by tunneling or other leakage mechanisms and are then collected at the gate 13, resulting in a gate current $I_G$. The rest of the electrons result in a substrate current $I_{sub}$ contribution, with generated holes adding to the drain current $I_{ds}$. Some of the impact induced electrons become trapped inside of the insulating layer 14 or become trapped at the interface of the channel 15 and the insulating layer 14. This attracts holes to the channel side of the channel/insulator interface, which cause the effective boundary of the P+ drain region 12 to shift closer to the source region. This is shown in FIG. 2, where drain is extended by the region 12', shortening the effective channel length to $L' \prec L_M$. Additionally, the oxide/silicon interface above channel region is damaged by the more energetic holes and electrons.

These effects degrade the transistor's operation in several ways. As these charges accumulate, the voltage needed at the gate to turn on the transistor, the device's threshold voltage $V_{th}$, changes, resulting in positive shift, $\Delta V_{th} > 0$. This makes the PMOS threshold voltage less negative and reduces the $V_{th}$ value at which the onset of leakage current is seen. When a sufficient number of trapped electrons are distributed over the manufactured length $L_M$ of the channel 15, a relatively large leakage current will flow through the transistor even when the gate voltage $V_G$ is set to an "off" level.

The damage to the interface results in a lower mobility, $\mu$, as the carriers flow form source 11 to drain 12. The lower mobility results in more resistance and lowers $I_{ds}$, where as the electrons trapped in the dielectric tend to raise the PMOS's $I_{ds}$ curve. The strength of these effects depend differently on bias conditions, but traditionally the change due to lower mobility has been smaller; however, as device sizes have decreased, this interface damage becomes more significant and, depending upon bias conditions, often becomes the larger effect below a quarter micron or so.

These problems are aggravated as device sizes decrease into the submicron region. One reason is that an amount of incursion of the region 12' that produces a relatively small relative change for a channel length of, say, $L_M \approx 1.5 \, \mu m$ becomes a much larger relative change at $L_M \approx 0.25 \, \mu m$. For example, if 12' extends an absolute distance of 0.051 μm, this produces a change of $$(L'-L_M)/L_M = -20\%$$

for the shorter channel length, but of only −3% at the longer length. Another reason is that as the electric field in the channel is given by $$E = V_{ds}/L,$$

the resultant field strength, and consequently the number of electron/hole pairs produced, increases greatly in a submicron device even at low power operation. For example, in a $L_M \approx 0.25 \, \mu m$ MOSFET operating at 2.5 volts results in fields of $\approx 10^7 V/m$. As L' departs further and further from $L_M$, the field strengths increase resulting in an even greater electron/hole pair production rate.

In the case of an NMOS transistor, the results of hot-carriers differ in several respects. Electrons will again be trapped in the dielectric and as the number of electrons in the oxide increases, a positive shift in voltage will again be needed at the gate to turn on the transistor results, $\Delta V_{th} > 0$. As $V_{th}$ is positive now, the threshold voltage becomes larger in magnitude and the $I_{ds}$ curve is lowered as the gate voltage must additionally overcome the negative charge embedded in the dielectric to cause the channel inversion.

The damage to the interface again lowers the mobility, μ, as the electrons flow form source 11 to drain 12, resulting in more resistance and lowering $I_{ds}$. Thus in this case, both effects move the $I_{ds}$ curve in the same direction. Also as with the PMOS, the strength of these effects depends differently on bias conditions, with the change due to lower mobility traditionally smaller but becoming increasingly important as device size shrink. Unlike the PMOS, though, the effective channel length does not decrease.

These hot electron effects build up over time causing the device to degrade as it ages. To determine the aging of a circuit as a whole, the degradation of the various devices within the circuit must be considered. As an example, consider the simple circuit shown in the schematic of FIG. 3, consisting of three inverters manufactured to be identical.

FIG. 3 shows three inverters, 20a, 20b, and 20c, connected in parallel with a capacitive load C 25a, 25b, and 25c connected to the output of each. Each of these inverters consists of a circuit like that of FIG. 4, with a PMOS transistor $P_a$ 21 and an NMOS transistor $N_a$ 22 connected as shown. To simulate the fresh circuit, a circuit simulation, such as of the SPICE or timing simulation type, can be performed using the same model card for each of PMOS transistors 21 and the same model card for each of the NMOS transistors.

To simulate the aged circuit, a model card representing the aged behavior of each of the elements needs to be used. To determine how the aged device will operate, the device is stressed to obtain the aging model information from the electrical test data. From this, the aged model card for the device can be extracted. However, the same aged model card can no longer be used for all of the similar devices. To see why, consider FIG. 3 again.

The amount of degradation in the PMOS 21 and the NMOS 22 of inverter 20a depends on the input signal supplied at node X, while the degradation in inverters 20b and 20c will instead depend on the input at nodes Y and Z, respectively. The waveforms at these nodes will differ from each other as the input waveform will change in both shape and magnitude as it propagates through the circuit. Thus, if the operation of a circuit after, say, 5 years, of use is simulated, the relative amount of degradation in each of the inverters will differ and, consequently, a different aged model card will be needed for each of the transistors. For even the simple circuit of FIGS. 3 and 4, this results in a three-fold increase in the required number of model cards for the aged circuit simulation compared with the fresh circuit. As a real circuit will often contain thousands or even millions of elements, the simulation of the aging of such circuits is a extremely complicated process for which a large number of improvements are desirable.

SUMMARY OF THE INVENTION

The present invention is directed to a number of improvements in methods for reliability simulations in aged circuits whose operation has been degraded through hot-carrier or other effects. According to a first aspect, the circuit operation at a plurality of different circuit ages or stress times can be performed within a single simulation, greatly reducing the time required over what would be needed if each circuit stress time were to be simulated separately.

Another aspect of the present invention allows for different aging criteria to be used for different elements. For example, the circuit can be broken down into blocks, such as an analog sector and a digital sector which, due to their differing functions, would have their degradation judged by different aging criteria. Alternately, or additionally, different degradation standards or aging criteria can be selected for different devices, such as PMOS compared to NMOS, or device types, such as a MOSFET compared to diode or a bipolar junction transistor. Similarly, different criteria can be used for different device models, different circuit blocks, or different circuit block types.

Other aspects which produce an increase in simulation efficiency allow for the user to specify the degradation of selected circuit elements independently of the simulation and to store the values of intermediate parameters in a lookup table. The table may be pre-specified, produced in an earlier simulation, or be the result of a partial simulation ran for the purpose of determining table values.

Techniques are also described for representing the aged device in the netlist as the fresh device augmented with a plurality of independent current sources connected between its terminals to mimic the effects of aging in the device, where the strength and connections of the current sources are based on modeling different aging mechanisms. The continuous value device degradations can be quantized to build the aged device models, to build current sources, or both, so that rather that doing the simulation for the continuous aging, it can be done in a series of quantized steps. The use of device model cards with age parameters is also described.

To further improve the circuit reliability simulation, a gradual or multi-step aging is used instead of the standard one step aging process. This gradual aging techniques includes the effects due to the degradation of $I_{ds}$, $I_{sub}$, and other parameters in determining how the elements of the circuit age.

In a further aspect of the present invention, the device characterization means, the device estimation means, the device degradation quantization means, the circuit netlist generation for aging simulation, and other features can be embedded into the circuit simulator. This will improve simulation efficiency and capability still further.

A user data interface is also presented to implement these techniques and further allow users to enter their device models not presented in the simulator. For example, a proprietary model of, say, the substrate current in an NMOS could be used with a SPICE simulator employing a different model to simulate the aging of the circuit.

Additional aspects, features and advantages of the present invention are included in the following description of specific representative embodiments, which description should be taken in conjunction with the accompanying drawings.

BRIEF DESCRIPTION OF THE DRAWINGS

FIG. 1 is a schematic drawing of a MOSFET transistor.

FIG. 2 shows the effects of aging due to the "hot-carrier" effect in the device of FIG. 1.

FIG. 3 is a schematic of a simple circuit used to discuss the effects of aging on a circuit.

FIG. 4 is a detail of the circuit of FIG. 3.

FIG. 5 is a flow chart of hot-carrier circuit simulation.

FIG. 6 shows multiple current sources to represent different degradation mechanisms for a MOSFET.

FIG. 7 is a block diagram of an interface for use in hot-carrier or other aging simulation.

FIG. 8 shows the entry of MOSFET in a netlist converted to a parameterized aged device model subcircuit call.

DESCRIPTION OF REPRESENTATIVE EMBODIMENTS

The various aspects of the present invention will be described with respect to the flow chart of FIG. 5. As described in the following, this flow differs from the prior art methods in some of the steps included as well as in the details of some of the steps that are found in the prior art. Although the discussion is mainly in terms of aging due to hot carriers, the techniques generally apply to circuit degradation due to the degradation of its constituent devices from other mechanisms.

Step 101 provides the netlist describing the circuit that will have the simulation controlling commands and reliability parameters of the present invention. This will include the various connections of the circuit elements and model cards for these elements as well as the age models. The age models may be those that are described in provisional U.S. patent application Ser. No. 60/236,587, entitled "Hot-Carrier Device Degradation Modeling and Extraction Methodologies", filed 29 Sep., 2000, which is hereby incorporated herein by this reference. In one improvement over the prior art, multiple hot-carrier circuit simulations can be accomplished in one run with one circuit simulation by setting proper hot-carrier simulation commands. This will improve simulation efficiency.

In the prior art flow, each run of a hot-carrier circuit simulation would require a complete run of all of the steps in the flow. For example, to simulate the operation of the circuit and determine its degradation after, say, 5 years and 10 years, a complete simulation would be performed for each of these values. Referring to FIG. 5, step 107 typically consumes by far the most time. By combining the simulation for multiple values, all of these stress times can be simulated with just one run of step 101-107. Although steps 109, 111, and 113 will each be performed for each parameter, by only requiring one simulation for the early steps—and particularly step 107—efficiency is greatly improved.

Another improvement of the present invention found in step 101 is that different device lifetime criteria can be applied for different circuit blocks, circuit block types, devices, device models, and device types in one or multiple hot-carrier circuit simulations. Examples of different lifetime criteria include using parameters such as $I_{ds}$ at different bias conditions, device transconductance, threshold voltage, model parameters, and so on for determining the amount of degradation. These criteria are parameters measurable before and after a circuit element is stressed and that are computable to use as a gauge of device degradation. The different criteria can be important in different areas of the circuit. For example, a circuit may contain both an analog block and a digital block of elements. The important degradation characteristics of these blocks may differ, with, say, transconductance $G_m$, $V_{th}$, or some other voltage behavior being used in the analog elements while for a digital part it would be driving capability of $I_{ds}$ or the circuits delay or speed. The different criteria can be important in determining individual device lifetime and setting a threshold value below which the device becomes unacceptable for circuit performance requirements, for example, when $I_{ds}$ or $G_m$ at some bias is degraded below a certain value.

Even when circuit blocks are of the same type, such as both being adders or inverters, different criteria can be applied if the degradation of the blocks can best be quantified by different parameter values. These criteria may be different device parameters, such as the gain $G_m$ or threshold values $V_{th}$, or the same parameter but with different values, say a $V_{th}$ shift of 100 mV in one block and 200 mV in another.

Similarly, differing criteria can be used for different devices, with say one criterion for PMOS and one for NMOS as these may have differing degradation mechanisms; for different models of the same device, such as an NMOS with different model cards due to, say, different sizes; or for different device types, as the important criteria for a MOSFET differ from those of a diode, which both differ from those of a bipolar junction transistor, and so on. For example, while driving capability may be important for both NMOS and PMOS devices within a given circuit block, leakage current may only be important for a PMOS in another block; or while driving capability may be the important quantity in MOSFETs, in a bipolar junction transistor the important performance criterion may be, say, emitter-base leakage current or current gain, $\beta = I_c/I_d$.

At step 103, the device degradation screening means allows a user to assign different amounts of device age, degradation and/or lifetime for different circuit blocks, circuit block types, devices, device models, and device types in absolute or relative scales. For those devices which have pre-specified degradations, the computation of their degradations can be skipped. Relevant device characterizations (shown in step 105) can also be skipped. This will improve simulation efficiency and reduce memory usage. This step is optional.

For example, in a circuit with an analog block and a digital block, it may be found that the analog block does not limit circuit life. The user could set this block as already having a specific absolute degradation value for better speed. Alternately, as a PMOS device usually suffers less degradation than an NMOS, the user could assign a smaller relative scale: If an NMOS ages amount x, the corresponding PMOS would age $\alpha \cdot x$, where $\alpha < 1$ is a proportionality parameter. In the circuit of FIGS. 3 and 4, setting a relative PMOS value would cut the transistor degradation calculations in half as the value used for PMOS 21 would be obtained from that of NMOS 22 instead of requiring a independent calculation.

The device degradation characterization means of step 105 is an optional step that characterizes the device degradation building tables which can be used during hot-carrier circuit simulation for device age, degradation and lifetime computations. The tables can be built during the hot-carrier circuit simulation or as part of a stand-alone process. In a stand-alone, a new table can be produced as part of a partial simulation ran for this purpose or be provided from another source. The tables can also be re-used for further simulations.

Different forms of table can be built. The ART (Age Rate Table) approach is one of the forms which builds a device age rate table under various bias conditions and which makes the device age calculation more efficient. Some other forms, such as an $I_{sub}$ table, an $I_{gate}$ table, and $I_{sub}/I_{ds}$ table for MOSFET transistors eliminate the need of $I_{sub}$ and/or $I_{gate}$ calculation which reduces the computation cost of MOSFET device degradation.

For example, the change in device age over a time $\delta t$ due to hot-electrons may be expressed in one model for an NMOS as $$\delta \text{Age}(t) = \frac{I_{ds}}{WH}\left(\frac{I_{sub}}{I_{ds}}\right)^m \delta t,$$

where H and m are the model's device degradation parameters and W is the devices channel width, and for a PMOS as $$\delta \text{Age}(t) = \left[ W_g \times \frac{1}{H_g} \left( \frac{I_{gate}}{W} \right)^{mg} + (1 - W_g) \times \frac{I_{ds}}{WH} \left( \frac{I_{sub}}{I_{ds}} \right)^m \right] \delta t,$$

where $H_g$ and mg are degradation parameters to include the gate current of the PMOS and $W_g$ is a weighting parameter. The age rate in the NMOS aging model above is then $$\text{rate} = \delta \text{Age}(t) / \delta t = \frac{I_{ds}}{WH} \left( \frac{I_{sub}}{I_{ds}} \right)^m \neq f(t),$$

that, for a sufficiently small δt, is a time invariant quantity that can be saved as a table. These formulae show how the current ratios are related to the device's age and that the larger the stress time t, the greater the age. For example, as these currents are functions of the bias voltages, $I_{ds}$, $I_{sub}$=f($V_{ds}$, $V_{gs}$, $V_{bs}$), these intermediate parameter values can be saved in a three dimensional table of $V_{ds}$, $V_{gs}$ and $V_{bs}$, or in a reduced dimensionality table if, say $V_{bs}$ is less important and the user wants to save memory. This intermediate quantity table can then be used whenever the parameter comes up. This can be implemented as a command, say table, to specify the values, .table Vds_start, Vds_stop, Vds_step, Vgs_start,
   Vgs_stop, Vgs_step or set up structure for the table. Tables can be in even or non-even steps.

The table can be provided before the simulation from an outside source, such as test data, since it is only for single device and does not need the netlist. Alternately, a simulation can be run just for producing such a table. The table size can be chosen by the user as this is a trade off between memory size and speed/accuracy. However, once the table is produced it can be saved for future use and not be rebuilt every time it is required. Additionally, the table can be built incrementally, with entries added for better resolution. The use of tables can also improve the simulation accuracy. If the table size is large enough, it will be more accurate than calculating on the fly.

The device degradation characterization means can be embedded into the circuit simulation of step 107. If a user has their own simulator for step 107 and source code or interface functions, step 105 can be combined into step 107. The advantage of keeping step 105 separate from step 107 is that the steps outside of 107 can be independent of simulator type.

Step 107 can be a standard prior art simulation and uses the fresh model. The possible circuit simulations could, for example, be a SPICE simulator (such as HSPICE or Spectre) or a timing simulator (such as Starsim or Timemill). As this produces the fresh waveform at all the nodes of the circuit, it determines the relative stress on the circuit elements. Memory usage can be minimized by virtue of the screening procedure as shown in step 103 and the characterization procedure as shown in step 105 as these reduce the number of waveforms that need to be stored. If step 107 stands alone, the process is more flexible as it can be used with the various prior simulators and the other steps can be connected through the interface as described below.

Using a separate simulator for step 107 is less efficient as it requires moving large amounts of data back and forth across the interface. If the simulation can be merged with other steps, it saves on both the time and storage required for this transferal. Embedding into the circuit simulator some, or all, of the functions from the device degradation characterization means (step 105), the device degradation estimation means (step 109), the device degradation quantization means (step 111), and the circuit netlist generation for aging simulation (step 113) will make the hot-carrier circuit simulation much more efficient and capable. This would let the whole flow to be performed as a single run, processing the data along with simulator and not requiring storage of all the other data. This can increase the total speed and capabilities of the flow by orders of magnitude. This embedded process can also combine the parameterized aged device model as described below. Note that this embedding can be done at the device level and not just at the block level.

Step 109 is the device degradation estimation to establish all of the ages for each transistor, or other aged device, specified in the netlist. The device degradation analysis will be more efficient because the relevant storage and computations for the devices pre-specified in step 103 can be skipped. Many devices suffer from multiple aging mechanisms that may have different relative importance depending upon bias conditions or other factors. For devices with multiple hot-carrier degradation taking effect, these devices will have multiple independent device age values each corresponding to one mechanism. These various age values will contribute to the total device degradation.

As already noted, the device degradation estimation means can be embedded into the circuit simulator. This may be implemented in the model evaluation module, but in this case the process depends upon the particular models employed. In one aspect of the present invention, the device degradation estimation means is embedded into the circuit simulator outside of the model part and is consequently independent of the particular models used. This allows newer device models to be incorporated without requiring the device age calculation having to embedded individually for each model.

Some examples of different aging mechanisms are the electron trapping and generation of interface state at the oxide/silicon interface. In addition to trapping electrons, the oxide may also capture holes in traps. Due to their differing charge, trapped holes will react to the resultant electric field at a bias level differently from the electrons: If the drain to gate voltage is positive, $V_{dg}=V_d-V_g>0$, the holes will migrate towards the gate and the electrons towards the drain. Thus, only holes can jump the interface at this bias, while the situation is reversed if $V_{dg}<0$.

At step 111, device degradation can be represented in the new circuit netlist by using the aged device models, by adding current sources, or both. In the first case, the elements and connections in the SPICE (or other simulation) netlist are not actually changed, but the aged model cards are used. As the voltage waveforms supplied to different elements are not the same, elements that have the same model card in the fresh simulation will generally have different aged model cards as the parameters will now differ. In the second case, connections of the netlist are changed by introducing current sources between device nodes, with independent current sources accounting for different degradation mechanisms. Examples of models which can be used for these current sources for MOSFETs are the DeltaMOS, DeltaLogId, and DeltaId models described in provisional U.S. patent application Ser. No. 60/236,587, entitled "Hot-Carrier Device Degradation Modeling and Extraction Methodologies", which was included by reference above.

Adding multiple current sources to represent different degradation mechanisms is shown in FIG. 6 for a MOSFET with multiple sources used simultaneously. In this example, for MOSFET 60 which has multiple hot-carrier degradation mechanisms, each mechanism will have a corresponding device age (as shown in step 109), and consequently, a current source $I_i$ 64–i, $1 \leq i \leq n$, will be added in parallel between the source S 62 and drain D 63. In this case, the aged device is represented in the new netlist by the fresh device between the nodes S' 62' and D' 63' and the aging effects separated out in the currents running from between the original source connection S 62 and the node S' 62' to between the original drain connection D 63 and the node D' 63'. Each of the multiple current sources, $$I_i = f_i(V_{ds}, V_{gs}, V_{bs}; P),$$

is added to cover the different mechanisms, where the functional form depends on the mechanism and where P represents the parameter set for the model, such as that described in provisional U.S. patent application Ser. No. 60/236,587, entitled "Hot-Carrier Device Degradation Modeling and Extraction Methodologies". The functional forms of the various $f_i$ will be from physically based models with parameters set by electrical test data.

In some case, a single mechanism may be represented by more than one current source. For example, although the channel in a fresh transistor may be symmetric between the source and drain, due to damage at the silicon-oxide interface this symmetry is lost as the circuit ages. Consequently, the current sources added for the aged device may include separate sources for forward and reverse biased conditions.

The continuous value device degradations can be quantized to build the aged device models, to build current sources, or both, so that rather than doing the simulation for the continuous aging, it can be done in a series of quantized steps. For example, say a circuit has a million transistors that have the same model card when new. As each of these will generally have a different age ranging from zero to a maximum value, the aged device simulation would have a million aged cards in the continuous case. In the quantized case, the age range from zero to the maximum value is broken up into, say, ten sub-ranges with a single age value used for each. Then only the discrete subset of ten model cards is used. The full interval need not be broken up into sub-ranges of uniform size if better resolution is more important in a particular range. The criteria for model quantization can be device age or any device parameters (such as $I_{ds}$ at different bias conditions, device trans-conductance, threshold voltage, etc.) degradations. The device degradation quantization means can be embedded into the circuit simulator. This step is optional.

In step 113 the aging circuit simulation is run with the different elements at their respective different aged models. Each of the simulations of step 113 will generally take significantly less time than the simulation already performed for the fresh device in step 107. This is because in running step 107, the simulation will record the waveforms at the required nodes. These nodes can be specified for particular devices in the screening stage. In step 113, only waveforms at the nodes that are needed for comparison with the fresh waveforms need to be stored. Thus, when doing a simulation for multiple ages in a single run, the ability to share steps 101-107 results in large increase in efficiency even though steps 109-113 must be performed individually for each age.

The above flow is the so-called "one step aging" circuit reliability simulation, where device ages and degradation are estimated using the fresh waveforms generated in step 107. However, as the circuit ages, the waveforms at the devices comprising the circuit will change. Therefore, the accuracy of the circuit reliability simulation should be improved if the circuit waveforms are updated during the degradation circuit simulation. This process will be called "gradual aging".

"Gradual aging" can be realized by adding a loop for steps 107, 109 and 111, as shown by the dotted line in FIG. 5, to update the models of the circuit simulator. Assuming the total circuit stress time is $T_n$, e.g., 10 years, $T_n$ is divided into N time intervals, $[T_0, T_1], [T_1, T_2], \ldots, [T_{n-1}, T_n]$, where $T_0$ is zero. The transient simulation time is T, which is usually much smaller than any above time intervals, for example 10 μs. In "one step aging", the circuit waveform from [0, T] is projected to the end of $T_n$, $$\text{Age}(T_n) = \frac{T_n}{T} \text{Age}(T),$$

or, for the 10 year, 10 microsecond example, $$\text{Age}(10\text{yr}) = \frac{10\text{yr}}{1\mu s} \text{Age}(1\mu s).$$

Instead, for gradual aging the projection will now be made for each time interval.

At the beginning of each time interval, device models will be updated according to device age values. Circuit simulation 107 will be launched using updated device models in each loop, with only the first time interval using the fresh device model. Device age and degradation will then be estimated for each loop in step 109. Device degradation can optionally be quantized and a new circuit netlist for the next time interval will be prepared in step 111. Thus, to make the "gradual aging" more accurate for MOSFET devices, in addition to making $I_{ds} = I_{ds}(t)$, degraded models for $I_{sub}$, $I_{gate}$, and intermediate values can be used for device degradation calculation. For example, in the NMOS hot-carrier aging model example of step 105, age is now a function of $I_{sub}(t)$ and $I_{ds}(t)$:

$$\text{Age}(t) = \sum_i \frac{I_{ds}(T_i)}{WH} \left( \frac{I_{sub}(T_i)}{I_{ds}(T_i)} \right)^m \Delta t_i.$$

This loop will continue until the final time interval is completed. While the flow calculated the device age parameters (H, m) using $I_{ds}$, $I_{sub}$, and so on at step 107 for the fresh simulation, the loop back from step 113 uses a differing model at step 107 as $I_{ds}$, $I_{sub}$, and the other parameters will change with time.

Open Data Interface

FIG. 7 is a block diagram of an open data interface (ODI) for use in hot-carrier or other aging simulations. The interface 203 is connected between the degradation simulator 201 and the user inputs 205. In block 205 some of information the user may supply is shown, although not all of these will necessarily be provided in all cases, and in some instance will be integrated into the simulator as described above with respect to step 107 of FIG. 5. This interface 203 places the hot-carrier circuit simulator 201 into the designer's environment, allowing the user to control the calculation of age and other functions by supplying their own, say, age equations and other models into the simulator through 205 to calculate age and degradation equations. This allows the user to customize the simulation to their needs.

Referring to block 205 in more detail, user defined data and models (such as device age 209, device degradation 211 and auxiliary functions 207) that will be used for device age and degradation calculation and user defined circuit simulator can communicate with the hot-carrier circuit simulator through ODI (203). The Circuit Simulator 213 can be of the SPICE or timing simulator type, or the user's adaptation or equivalent. Device instance and model parameters are passed from the hot-carrier circuit simulator 201 through the ODI 203 to user defined data 205. For example, if the channel width W of a MOSFET is needed for the age calculation or the bias conditions are needed for the auxiliary functions, the hot-carrier circuit simulator 201 can provide these values. Similarly, user defined data and the simulation results from the user defined circuit simulator are passed back to hot-carrier circuit simulator 201 through ODI 203.

The user can also supply auxiliary functions to replace or supplement the equations found in the hot-carrier circuit simulator 201. For example, $I_{gate}$ and $I_{sub}$ are sample auxiliary functions. The simulator will provide default equations, but the user may provide auxiliary function that are lacking or for which the user has a proprietary model that they prefer over the default model for their application. For the example of $I_{sub}$, many different model for the substrate current exist and the user may prefer a particular one in their application, such as described in co-pending U.S. patent application Ser. No. 09/661,328, filed on 14 Sep., 2000, entitled "MOSFET Modeling for IC Design Accurate for High Frequencies", which is hereby incorporated herein by this reference. The user can select which function they supply, just specifying a module for, say, $I_{sub}$, and using default modules for others.

Input parameters, intermediate and final results can be shared among all the user defined data, such as passing $I_{sub}$ to $I_g$, as $I_g \propto I_{sub}$. This can also include bias conditions, so that a function, say, age can now be a function of parameters beyond $I_{ds}$, age→age($I_{ds}$, $V_{ds}$, $V_{gs}$, $V_{bs}$), and so on. Multiple user defined data of the same functionality (such as the device age) can be integrated with the other user defined data. The user may have multiple equations of how, say, age model is calculated and may call any of these. Users have the flexibility to choose any one of them. User defined data can also be combined with the internal data in the hot-carrier circuit simulator (201) to fulfill the device age/degradation calculation. Again, these can be data that come with device or add in some proprietary ones the user has added in. The user defined data can be incomplete. For any of the user definable data not defined, internal data will be used. User defined functions can access intermediate results of circuit simulation, such as the saturation voltage, $V_{dsat}$, or threshold voltage, $V_{th}$, and not just $I_{ds}$.

Parameterized Aged Device Model

Another approach that can be used to study circuit degradation is the use of a parameterized device model. This method can be used to replace the above approach through use of a parameterized model card for each of the specified circuit elements, or can be used in a complementary fashion, with some of devices using the parameterized model as described below and the rest of the devices treated as above. Each model parameter can be formulated as a function of several intermediate quantities that measure device degradation, such as device age or other device parameter ($I_{ds}$, $V_{th}$, $G_m$, and so on). We will use device age as an example hereinafter.

Because aged device parameter is a function of device age, device model card can be parameterized with the device age as a parameter. This implies that one model card can be used by devices of different device age values. Age value can be quantized to limit the number of aged device models if a circuit simulator needs to predetermine the models at the start of simulation. One sample model card could be expressed as .model nmos nmos vth0='0.7+5*age', where vth0 is the model parameter related to the threshold value and the other model parameters are suppressed for simplicity. The functional form of the parameters, such as the shown linear relation for the threshold voltage, can either be experimentally determined, or have a functional form based on physical model with the coefficients experimentally determined. The building of age models is described more fully in provisional U.S. patent application Ser. No. 60/236,587, entitled "Hot-Carrier Device Degradation Modeling and Extraction Methodologies", which was included by reference above.

The circuit simulator can then accept device age as an instance parameter. One example is listed as follows:

m1 1 2 3 4 nmos W=10 u L=0.25 u age=0.01

This age value will be used for calculating aged device model parameters. To obtain the age values for the devices in the netlist, the steps 101-109 in the flow of FIG. 5 can still be performed, but the preparation of the netlist in step 111 is different. The age value can also be specified.

In simulators that do not support age as an instance parameter, a macro or subcircuit can also be used to prepare aged device model parameters from a device age value. An auxiliary program can convert each degradable device to a subcircuit call. The advantage of this approach is that currently available circuit simulators widely support this netlist style even if they do not accept device age directly as an instance parameter. The examples of FIG. 8 shows the entry of MOSFET m1 in a netlist converted to a subcircuit call Xm1 with the device age value of age1. The left and right show two differing results, on the left converting to a subcircuit to introduce the age and on the right to compute a parameter (here vth0 as above) from this value. The value of age1 will be used to prepare the aged device model for m1. The use of subcircuits is described more fully in co-pending U.S. patent application Ser. No. 09/661,328, filed on 14 Sep., 2000, entitled "MOSFET Modeling for IC Design Accurate for High Frequencies", that was incorporated by reference above.

According to another aspect, device age calculation and aged device model parameters can be accomplished inside the model evaluation module for each device. A circuit simulator contains both an engine to solve the circuit and the model evaluation module. Rather than compute an expression such as, say, vth0='0.7+5*age' in the engine, the model evaluation module can alternately calculate vth0=f(age). A model flag can be used to control whether the computation of the device age and the aged device model parameter should be carried out. For example, this can be implemented .model nmos nmos aging_flag=1 where the other parameters are again suppressed. If the flag is set to 1, the aged device model parameter will be calculated based on the parameterized equation. This would occur in the circuit simulation 107 and present a more integrated approach to compute $I_{ds}$ and other output values. If the flag is set to 0, the calculation would not occur, as would be the case in simulating the fresh model or when the user prefers to use the full flow of FIG. 5.

Many aspects of the methods of the present invention will most commonly be implemented in software as a computer program product, although many of these can be implemented in hardware or by a combination of software and hardware. As will be understood in the art, the invention or components thereof may be embodied in a fixed media program component containing logic instructions and/or data that when loaded into an appropriately configured computing device cause that device to perform according to the invention. As will be understood in the art, a fixed media program may be delivered to a user on a fixed media for loading in a user's computer or a fixed media program can reside on a remote server that a user accesses through a communication medium in order to download a program component. Examples of such fixed media include a disk-type optical or magnetic media, magnetic tape, solid state memory, etc. The invention may be embodied in whole or in part as software recorded on this fixed media.

The invention also may be embodied in whole or in part within the circuitry of an application specific integrated circuit (ASIC) or a programmable logic device (PLD). In such a case, the invention may be embodied in a computer understandable descriptor language which may be used to create an ASIC or PLD that operates as herein described.

Although the various aspects of the present invention have been described with respect to specific exemplary embodiments, it will be understood that the invention is entitled to protection within the full scope of the appended claims.

The invention claimed is:

1. A system for a user to simulate the degraded operation of a circuit, comprising:
    a circuit degradation simulator;
    a user defined circuit simulator, wherein said user defined circuit simulator allows the user to input a user selected circuit simulator and user data comprising:
        a netlist representation of the circuit; and
        a circuit stress time value; and
    an interface for connecting the user defined circuit simulator to the circuit degradation simulator, whereby the circuit degradation simulator determines the operation of the circuit at the circuit stress time value utilizing said netlist representation in the user selected circuit simulator.

2. The system of claim 1 wherein said user selected circuit simulator is a SPICE type simulator.

3. The system of claim 1, wherein said user selected circuit simulator is a timing simulator.

4. The system of claim 1, wherein said user data further comprises:
    a user selected device age model, wherein the circuit degradation simulator utilizes said user selected auxiliary function in determining the operation of the circuit at the circuit stress time value.

5. The system of claim 1, wherein said user data further comprises:
    a user device degradation model, wherein the circuit degradation simulator utilizes said user device degradation in determining the operation of the circuit at the circuit stress time value.

6. The system of claim 5, wherein said user data further comprises:
    a user selected auxiliary function, wherein the circuit degradation simulator utilizes said user selected auxiliary function in determining the operation of the circuit at the circuit stress time value.

7. The system of claim 6, wherein intermediate results in determining the operation of the circuit at the device age parameter are exchanged between said user device degradation model and said user selected auxiliary function.

8. The system of claim 7, wherein said user selected auxiliary function is the substrate current.

9. The system of claim 7, wherein said user selected auxiliary function is the gate current.

* * * * *